US006624498B2

United States Patent
Filas et al.

(10) Patent No.: US 6,624,498 B2
(45) Date of Patent: Sep. 23, 2003

(54) MICROMAGNETIC DEVICE HAVING ALLOY OF COBALT, PHOSPHORUS AND IRON

(75) Inventors: Robert W. Filas, Bridgewater, NJ (US); Trifon M. Liakopoulos, Long Beach, NY (US); Ashraf Lotfi, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/028,594

(22) Filed: Dec. 20, 2001

(65) Prior Publication Data

US 2002/0153258 A1 Oct. 24, 2002

Related U.S. Application Data

(62) Division of application No. 09/552,627, filed on Apr. 19, 2000, now Pat. No. 6,495,019.

(51) Int. Cl.⁷ .............................. H01L 29/00; H01F 5/00
(52) U.S. Cl. .................. 257/528; 257/531; 257/421; 336/225
(58) Field of Search ................................ 257/421, 528, 257/531, 696, 698; 336/65, 68, 225, 223, 230, 186, 187

(56) References Cited

U.S. PATENT DOCUMENTS

| | | | |
|---|---|---|---|
| 3,993,515 A | 11/1976 | Reichert | 156/3 |
| 4,988,413 A | 1/1991 | Chakravorty et al. | 204/15 |
| 5,149,615 A | 9/1992 | Chakravorty et al. | 430/313 |
| 5,226,232 A | 7/1993 | Boyd | 29/846 |
| 5,256,479 A * | 10/1993 | Tokuoka et al. | 428/328 |
| 5,435,903 A | 7/1995 | Oda et al. | 205/77 |
| 5,513,430 A | 5/1996 | Yanof et al. | 29/846 |
| 5,788,854 A | 8/1998 | Desaigoudar et al. | 216/13 |
| 5,846,441 A | 12/1998 | Roh | 216/22 |
| 5,991,990 A | 11/1999 | Bernstein | 29/25.41 |
| 2003/0042569 A1 * | 3/2003 | Ahn et al. | 257/528 |

FOREIGN PATENT DOCUMENTS

| | | | |
|---|---|---|---|
| EP | 0422760 A | 4/1991 | C25D/3/56 |
| JP | 55085649 | 6/1980 | |

OTHER PUBLICATIONS

Jae Y. Park and Mark G. Allen, *New Micromachined Inductors On Silicon Substrates*. IEEE Trans. on Magnetics, vol. 35, No. 5, 1999, pp. 3547–3549.

T. Sato, Y. Miura et al., *New applications of nanocrystalline Fe(Co—Fe)—Hf—O magnetic films to micromagnetic devices*, J. Applied Physics, vol. 83, No. 11, 1998, pp. 6658–6660.

(List continued on next page.)

*Primary Examiner*—Minh Loan Tran
*Assistant Examiner*—Thomas L Dickey

(57) ABSTRACT

The process is provided involving formation of multilayer components in which a photoresist-type material is used not only as a conventional patterning material, but also as an insulating and/or planarizing material between magnetic or electrically conductive layers. A variety of integrated CMOS/micromagnetic components are thereby capable of being formed, including components containing planar inductors and transformers. Additionally, a particular technique is used to etch gold-containing seed layers from a substrate surface without damaging an electroplated copper coil. Also provided is a magnetic material particularly useful in devices such as inductors and transformers. The material is an amorphous iron-cobalt-phosphorus alloy having a composition of $Co_xP_yFe_z$, where $x+y+z=100$, x is 5 to 15, y is 13 to 20, and z is the remainder. The alloy typically exhibits a coercivity of 0.1 to 0.5 Oe, an electrical resistivity of 100 to 150 $\mu\Omega$-cm, and a saturation magnetization of about 16 to about 19 kG, all of which represent improvements over Permalloy.

20 Claims, 5 Drawing Sheets

OTHER PUBLICATIONS

Jae Y. Park, Suk H. Han and Mark G. Allen, *Batch–Fabricated Microinductors with Electroplated Magnetically Anisotropic and Laminated Alloy Cores*, IEEE Trans. on Magnetics, vol. 35, No. 5, 1999, pp. 4291–4299.

Jun–Bo Yoon, et al., *Monolithic Integration of 3–D Electroplated Microstructures With Unlimited Number of Levels Using Planarization With A Sacrificial Metallic Mold (PSMM)*, IEEE International Micro Electro Mechanical Systems Conference, New York, 1999, pp. 624–629.

Miyajima, H. et al., "High–Aspect–Ratio Photolithography for MEMS applications", *IEEE, Journal of MEMS*, vol. 4, No. 4 (1995).

Lochel, B. et al., "Electrodeposited Magnetic Alloys for Surface Micromachining", *J. Electrochem. Soc.*, vol. 143, No. 10 (1996).

Loechel, B. et al., "Micro Coils Fabricated by UV Depth Lithography and Galvanoplating", Sensors and Actuators (1996).

Guckel, H. "Micromechanics for x–ray lithography and x–ray lithography for micromechanics," *Precision Engineering and Optomechanics, SPIE*, vol. 1167, 151–158 (1989).

Lowrie, C. F. "Iron Plating," *Metal Finishing*, '99 Guidebook and Directory Issue, vol. 97, No. 1 (1999).

Hironaka, K. et al., Soft Magnetic Properties Of Co—Fe—P and Co—Fe—Sn—P Amorphous Films Formed By Electroplating, *IEEE Transactions On Magnetics*, vol. 26, No. 5, 2421–2423 (1990).

Takai, M. et al., "Preparation Of Soft Magnetic FePCo Thin Films With High Bs By Means Of Electrodeposition", *Electrochemical Society Proceedings*, vol. 95–18, 552–562.

Herreros, J. et al., "Preparation of Fe—Co—P amorphous alloys by electrodeposition" *J. of Non–Crystalline Solids* 201, pp. 102–109 (1996).

* cited by examiner

MICROMAGNETIC DEVICE HAVING ALLOY OF COBALT, PHOSPHORUS AND IRON

This is a divisional of application Ser. No. 09/552,627, filed on Apr. 19, 2000, now U.S. Pat. No. 6,495,019.

BACKGROUND OF THE INVENTION

1. Field of the Invention

The invention relates to micromagnetic components for power applications.

2. Discussion of the Related Art

There is an increasing market for compact and efficient portable electronic devices such as notebook computers and cellular telephones. This increasing market has established the need for both a reduction in size and an improvement in efficiency in the associated power integrated circuits. Specifically, to reduce power consumption and increase battery life, integrated power management is being sought, e.g., single-chip power components such as on-chip DC—DC converters. An essential aspect of such integration is the merging of CMOS and magnetic elements onto a single chip. In particular, planar inductors and transformers, operated at high frequencies, are the fundamental magnetic elements of such DC—DC converters. In addition, current magnetic materials used in inductors and transformers, e.g., Permalloy, suffer from some limitations that would be undesirable for such on-chip power devices. For example, Permalloy's adherence tends to be less than desired, and the alloy has some limitations in frequency range due to its electrical conductivity.

Thus, improved techniques for forming micromagnetic components for integrated CMOS/power applications, as well as improved materials for such components, are desired.

SUMMARY OF THE INVENTION

The process of the invention involves forming multilayer components in which a photoresist-type material is used not only as a conventional patterning material, but also as an insulating and/or planarizing material between magnetic or electrically conductive layers. This use of photoresist as part of the overall component structure is unique to LIGA-type processes. (LIGA is a German acronym that stands for, in English, lithography, plating, molding. See, e.g., H. Guckel, "Micromechanics for x-ray lithography and x-ray lithography for micromechanics," *Precision Engineering and Opto-Mechanics*, SPIE, Vol. 1167, 151–158 (1989) for a general discussion of LIGA processes.) According to the invention, a variety of integrated CMOS/micromagnetic components are capable of being formed, including components containing planar inductors and transformers. Additionally, in one embodiment of the process, a particular technique is used to etch gold-containing seed layers from a substrate surface without damaging an electroplated copper coil. Such a technique is useful when electroplating copper onto such a seed layer, because most chemicals used to etch away the gold will, in the absence of such a technique, damage the copper coil.

The invention also relates to a magnetic material particularly useful in devices such as inductors and transformers. The material is an amorphous iron-cobalt-phosphorus alloy having a composition of $Co_xP_yFe_z$, where x+y+z=100, x is 5 to 15, y is 13 to 20, and z is the remainder. In one useful embodiment, x is 11 and y is 17. The cobalt and iron provide relatively high saturation magnetization and low coercivity, while the phosphorus is present in an amount that provides an amorphous structure, but does not unacceptably lower the saturation magnetization. The alloy typically exhibits a coercivity of 0.1 to 0.5 Oe, an electrical resistivity of 100 to 150 $\mu\Omega$-cm, and a saturation magnetization of about 16 to about 19 kG, all of which represent improvements over Permalloy.

DETAILED DESCRIPTION OF THE INVENTION

Integrated CMOS/Micromagnetic Component

Figure 1A:
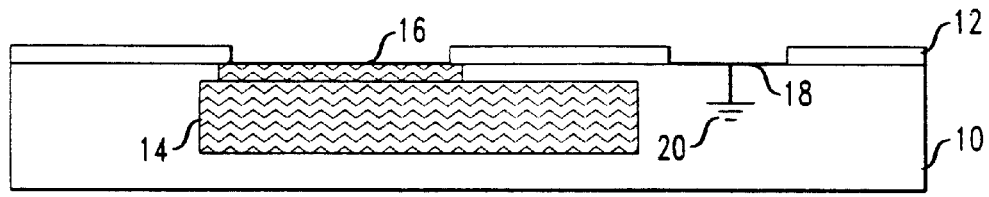
FIGS. 1A–1H illustrate one embodiment of the process of the invention.

The process of the invention involves forming multilayer components in which a photoresist-type material is used not only as a conventional patterning material, but also as an insulating and/or planarizing material between magnetic or electrically conductive layers. (Planarizing indicates that the material provides both physical support for subsequent layers as well as a relatively planar surface for subsequent fabrication steps.) According to this process, it is possible to form a variety of planar micromagnetic components, e.g., inductors and transformers, as well as numerous other components, e.g., electromagnets, filters (e.g., high pass, low pass), relays, mechanical particle filters, and a variety of other MEMS devices. Specifically, the multilayer articles of the invention are formed by the basic process steps of:

(1) providing a substrate, typically silicon, having an integrated circuit device incorporated therein;

(2) forming a first patterned photoresist layer over the substrate;

(3) forming a magnetic material layer in the first pattern, typically by electroplating onto a metal seed layer;

(4) forming an insulating or planarizing/support photoresist layer over the magnetic material layer;

(5) forming a second patterned photoresist layer on the insulating or planarizing/support photoresist layer; and (6) forming an electrically conductive material (e.g., a winding) in the second pattern, again, typically by electroplating onto a metal seed layer.

(As used herein, layer indicates a continuous or discontinuous material layer, e.g., a winding or other patterned layer, regardless of the fact that layer is used in this description both with and without the modifying term patterned. Electrically conductive indicates a sheet resistance of no more than 1 ohm/square). These steps are further elucidated by the embodiment described below.

It is possible to form the active layers (active meaning, e.g., magnetic or electrically conducting layers) in any order. For example, in the basic process set forth above, a possible alternative is to form an electrically conductive material layer in the pattern defined by the first photoresist, and then form a magnetic material layer in the pattern defined by the second photoresist. Typically, as reflected in the embodiment below, additional layers are present, e.g. an additional magnetic material layer formed in a pattern defined by a third patterned photoresist layer, and additional insulating or planarizing/support photoresist layers.

Any magnetic material layers are generally formed in a thickness of at least 2 μm, more typically at least 5 μm. Similarly, any electrically conductive layers are typically formed in a thickness of at least 5 μm, more typically at least 30 μm. Particularly because of these thicknesses, the active layers of various metals, e.g., magnetic and electrically conductive materials, are typically formed by electroplating. Insulating and planarizing photoresist layers are generally formed in a thickness of at least 2 μm. The thicknesses of photoresist layers that define a pattern in which magnetic or electrically conductive materials are electroplated vary depending on the desired thickness of the electroplated material.

According to one embodiment of the process, a planar inductor, optionally a double-spiral planar inductor, is formed. As shown in FIG. 1A, a silicon wafer 10 is provided with a passivation or insulation layer 12 on its top surface, typically an oxide present in a thickness of about 2 μm. The wafer typically contains an integrated circuit-type device, e.g., a CMOS power circuit 14, and the insulation layer 12 contains one or more vias 16, 18 to provide electrical connection between the circuit 14 and the inductor, and to provide a ground 20 for the magnetic cores of the device. (In other embodiments, a variety of control circuits are capable of being incorporated within the substrate.)

Figure 1B:
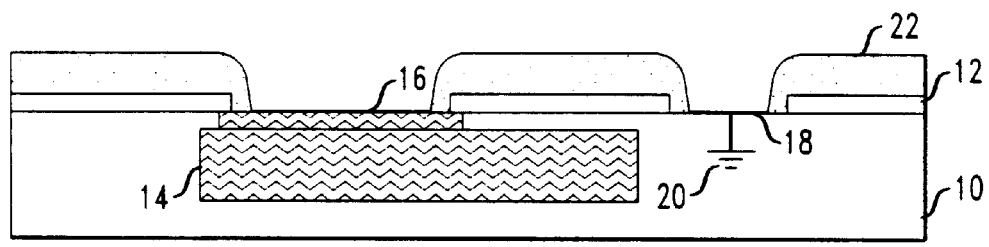

As shown in FIG. 1B, a layer 22 is formed to provide an insulating and planarizing layer between the substrate 10 and the to-be-formed inductor. Typically, the insulating layer is a photoresist layer 22 that is patterned to maintain the vias 16, 18. Advantageously, the photoresist is a Novolac-type positive photoresist sensitive to UV light, such as the AZ-4000 series sold by AZ Electronic Materials, a division of Clariant Corporation. The photoresist advantageously is substantially inert to aggressive chemical environments, such as electroplating solutions. Good adhesion to a variety of metals is also desirable, since metal seed layers for electroplating are often formed on the resist. In addition, when it is desired to incorporate the photoresist as an insulating and/or planarizing layer, the resist advantageously exhibits desirable mechanical and electrical properties. Specifically, in multilayer components, the resist advantageously has the ability to provide a planar surface for subsequent lithography and layer formation. And desirable electrical properties include an acceptable dielectric constant when cured. Depending on the desired thickness of the photoresist layer 22, it is possible that the layer will constitute several thin layers. Patterning of the photoresist is performed according to conventional techniques, based on the particular photoresist being used. Curing is used to render the photoresist substantially inert to subsequent environments, e.g., electroplating solutions.

Figure 1C:
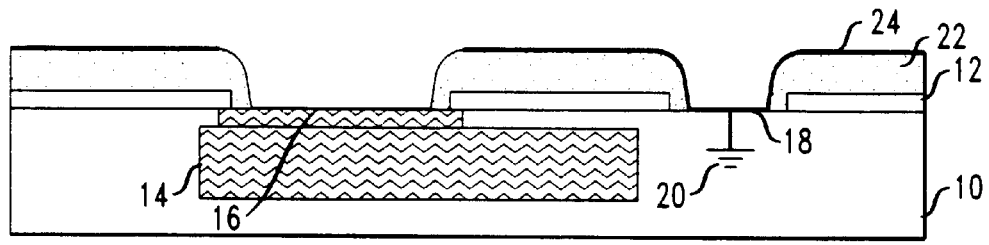

As shown in FIG. 1C, after the patterned photoresist layer 22 is formed, a relatively thin metallic film 24 is formed to act as a seed layer for subsequent electroplating of a lower magnetic core plate of the inductor. A useful material for the film 24 is a two-layer titanium/gold film, e.g., about 125 to 300 Å of titanium followed by 500 to 3000 Å of gold. The gold exhibits desirable resistivity and chemical properties, and the titanium enhances adhesion of the gold to the cured photoresist 22. The gold and titanium are typically deposited by sputtering or electron-beam deposition. It is also possible to use a titanium/copper seed layer.

Figure 1D:
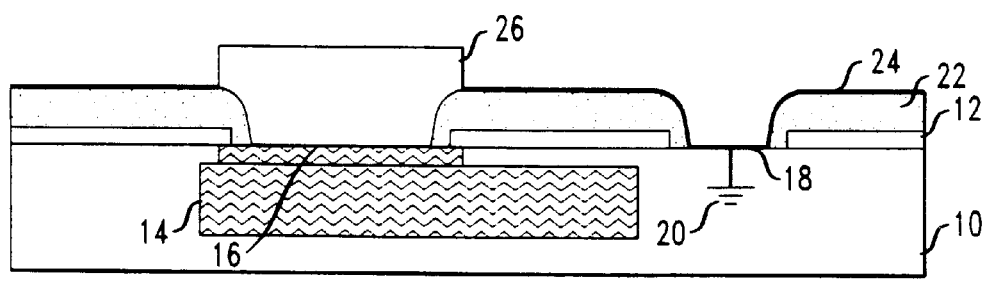

As shown in FIG. 1D, a patterned photoresist layer 26 is formed and patterned for subsequent formation of the lower magnetic core plate. The thickness of the photoresist layer 26 is based on the desired thickness of the magnetic core, i.e., the magnetic material is generally electroplated up to the top surface of the photoresist.

Figure 1E:
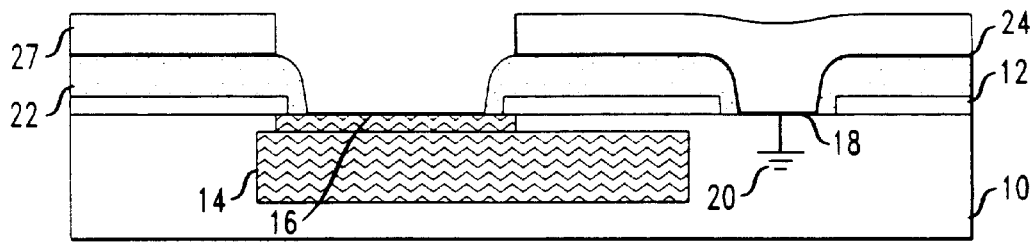

As shown in FIG. 1E, after formation of the photoresist layer 26, a lower magnetic core 27 is formed by electroplating onto the seed layer 24, and the resist layer 26 is then removed. The magnetic core 27 is formed from any suitable magnetic material, typically a soft magnetic material for inductor and transformer applications, e.g., Permalloy. Advantageously, the magnetic core 27 is formed from the Fe—Co—P alloy of the invention, as discussed in more detail below. The properties of a desirable inductor core material include relatively low coercivity, relatively high electrical resistivity, and relatively high saturation magnetization.

Figure 1F:
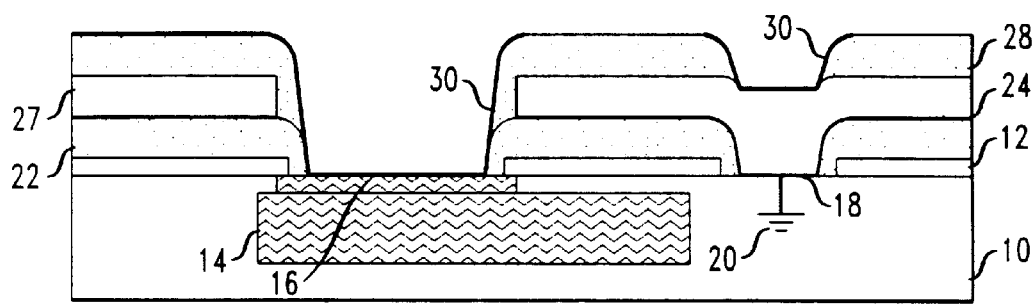

As shown in FIG. 1F, another photoresist layer 28 is formed as an insulating and planarizing layer (and is patterned to retain the vias). And then a metallic seed layer 30, typically of the same material and properties as the previous seed layer 24, is formed on selected regions of the photoresist layer 28. In particular, as shown in the Figure, the seed layer 30 is patterned in a manner that avoids creation of a short circuit between spires of the to-be-formed coil. (Alternatively, portions of the seed layers that create such short circuits are removed later.)

Figure 1G:
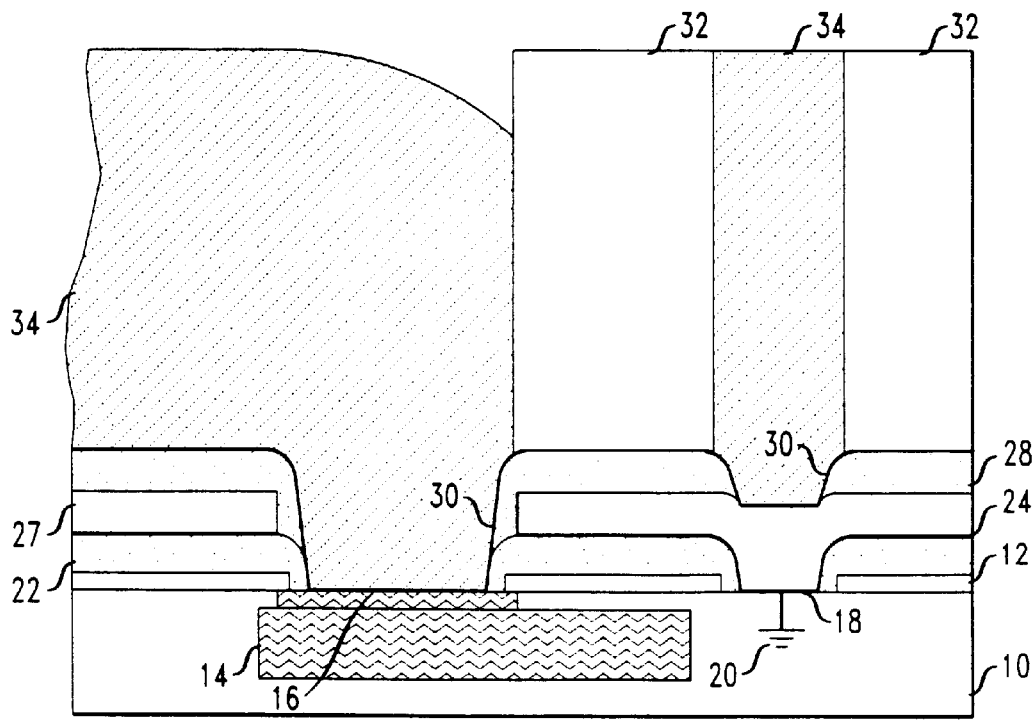

Next, as shown in FIG. 1G, a patterned photoresist layer 32 is formed to provide a mold for formation of the conductive coil 34, which is typically a copper coil. The coil 34 is then formed by electroplating onto the seed layer 30. The thickness of the coil 34, and the photoresist 32, is typically about 30 μm in this embodiment. The photoresist layer 32 is not removed, but instead remains to act as an electrical insulator and a planar, mechanical support layer within the inductor.

Figure 1H:
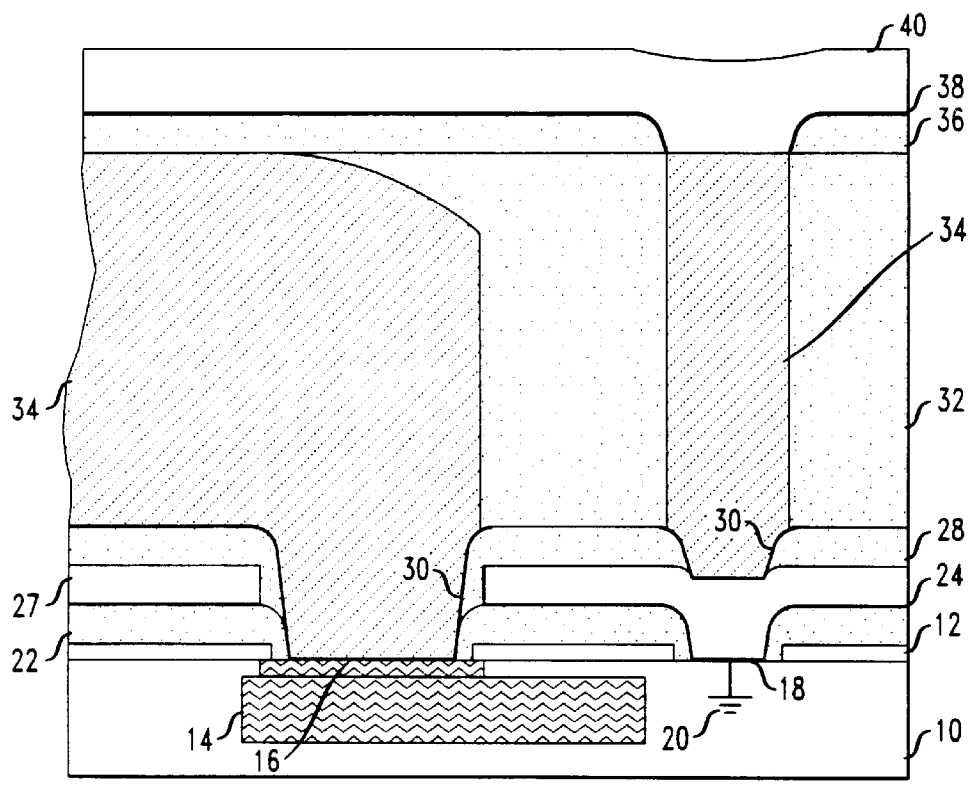

As shown in FIG. 1H, a top photoresist layer 36 is formed to provide an insulating and planarizing layer. (It is possible to cure both the previous photoresist layer 32 and this subsequent photoresist layer 36 simultaneously.) A seed layer 38 is formed for electroplating, the layer typically of the same material and properties as the previous seed layers. A patterned photoresist layer (not shown) is then formed to provide a mold for subsequent electroplating of the top magnetic core 40, with the thickness of the photoresist selected to provide a core 40 of substantially the same thickness. Finally, the top magnetic core 40 is electroplated, with the material and technique typically being the same as the low magnetic core 26. The photoresist layer is then removed. Optionally, an additional insulating material is formed over the magnetic core 40 for protective purposes.

Figure 2:
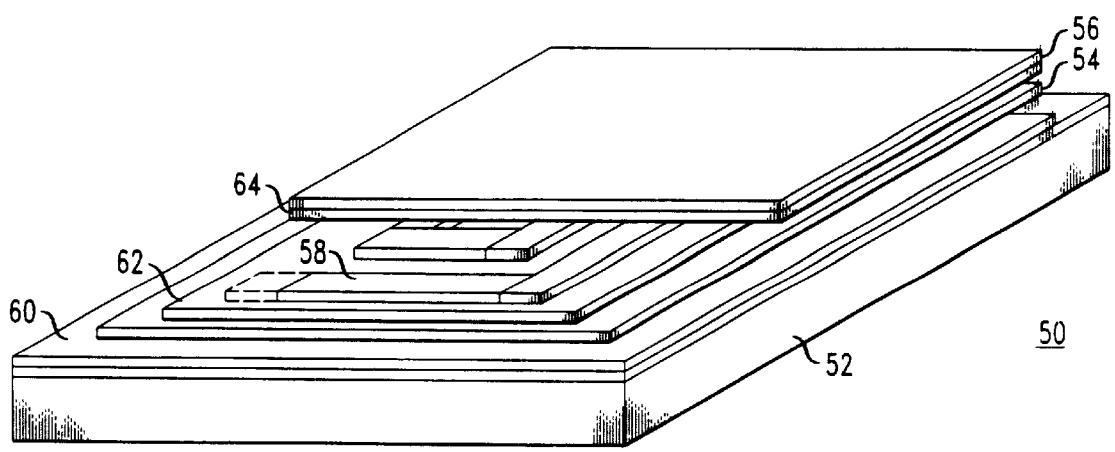
FIG. 2 illustrates a device formed according to the invention.

The resulting integrated CMOS/micromagnetic component 50 is shown schematically in FIG. 2. The component 50 contains a substrate 52 in which a CMOS circuit (not shown) is formed, lower and upper magnetic cores 54, 56, a spiral inductor 58 (only one spiral is shown), along with intermediate cured photoresist layers 60, 62, 64. In one embodiment, the lower and upper magnetic cores 54, 56 are formed from the Fe—Co—P alloy discussed below, and are about 5 μm thick. The dual spiral inductors are formed from copper in a thickness of about 30 μm. And the intermediate photoresist layers 60, 62, 64 are formed from one or more AZP-4000 series photoresists.

Numerous variations of this particular embodiment are possible, including performance of the steps above in different order and with additional or alternative layers, and will be apparent to those skilled in the art of lithographic and plating techniques.

Figure 3A:
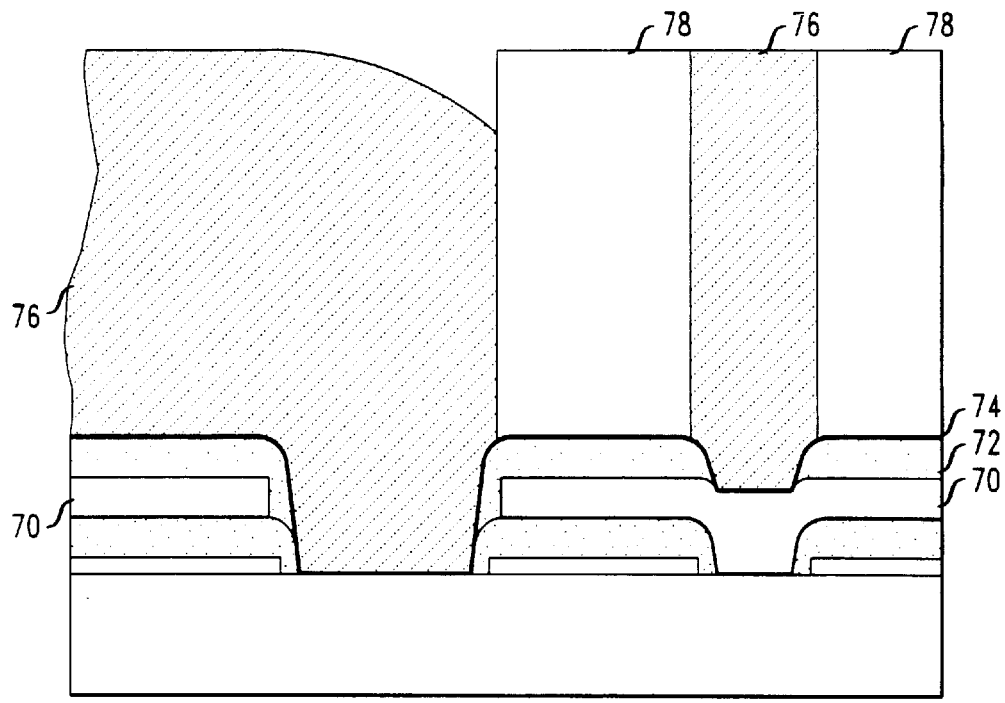
FIGS. 3A and 3B illustrate a gold seed layer etch technique according to the invention.

For example, an alternative to the steps illustrated in FIGS. 1F and 1G, shown in FIG. 3A, is to form a more continuous seed layer 74 as compared to the above embodiment, and then remove portions of the seed layer 74 after coil 76 formation to avoid shorts between adjacent windings. (The seed layer 74, as in the above embodiment, is formed over an insulating material (e.g., a photoresist) layer 72 that is formed on a magnetic material 70.) As shown in FIG. 3A, a photoresist 78 is patterned over the seed layer 74, and the coil 76 is then formed using the photoresist 78 as a mold.

Figure 3B:
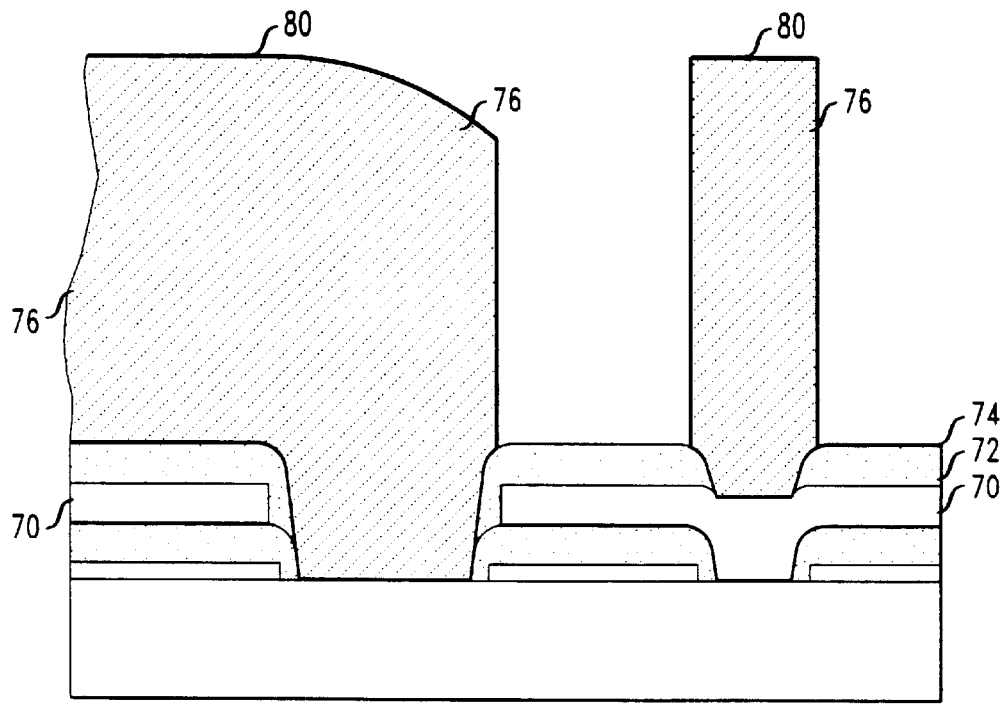

Once the photoresist is removed, typically by a conventional chemical etch, the seed layer 74 must be removed in the regions lying between adjacent windings of the coil 76, to prevent short circuits. However, a potential problem with removing selected portions of a titanium/gold seed layer is that most gold etches will also remove copper (which is the most prevalent winding material). The invention overcomes this problem by selectively removing the seed layer 74 by way of an oxide formation technique. Specifically, as shown in FIG. 3B, an oxygen plasma is used to both remove any organic residues remaining from the photoresist layer 78 and to form a thin oxide 80 on the surface of the coil 76, e.g., copper oxide. (A typical plasma treatment is 2 to 3 minutes at 200 to 300 mW and 1 mTorr.) This oxide renders the coil 76 material substantially inert to the gold etch. The gold and titanium are then able to be etched without damaging the coil 76. And once the seed layer is removed, the copper oxide layer 80 is similarly removed by a suitable method. For example, the gold is capable of being removed with an aqueous solution of KI/I in a 20:1 weight ratio and with a KI concentration of 0.16 molar. The titanium is capable of being removed with an aqueous HF solution, e.g., 0.5%, or by an oxalic acid solution. And the copper oxide is readily removed with a short, e.g., 5 second, treatment in a solution of $H_2SO_4$:$H_2O_2$(30%):$H_2O$ at a ratio of 1:1:10 Other suitable etching techniques are known to those skilled in the art.

Photoresist Techniques

As discussed above, the photoresist is advantageously a Novolac-type positive photoresist sensitive to UV light, such as the AZ-4000 series sold by AZ Electronic Materials, a division of Clariant Corporation. A variety of viscosity grades are available, depending primarily upon the desired film thickness, e.g., over typical ranges of 3 to 50 $\mu$m. Different coat versions are available as well, depending on the particular application technique, e.g., spin coat, spray coat, or roller coat. The following techniques for using such photoresists provide desirable results in the invention.

Layer Formation:

For high film thickness (e.g., more than 10 $\mu$m), it is possible for multiple spin coatings to be performed. The multiple spin process starts by applying the first layer to the substrate. Before spinning on the second layer, a short soft-bake step is performed, e.g., baking on a hot plate at 80° C. for 2 minutes. The wafer is then placed back on the spinner to perform the second coating, then a relaxation period of about 5 to 6 minutes is provided, followed by a subsequent soft-bake at 110° C. The same process is repeated for subsequent layers, with a soft-bake after each layer is formed. The particular bake conditions will vary depending on the total number of layers being formed. These soft bakes provide for evaporation of solvent from the individual layers, and thereby ease the final bake treatment. The relatively short soft-bake time avoids detrimental effects on the subsequent photoresist behavior. And the relaxation time, generally 4 to 8 minutes at room temperature, allows for solvent evaporation, thickness uniformity, and photoresist stabilization. A horizontal and air-turbulence-proof position is desired during the relaxation.

Thick photoresist layers tend to form an edge bead during the spin cycle, and removal of the bead is desirable to provide good contact between the photoresist surface and the photo-mask during the exposure process. It is possible to apply a solvent to the edge bead with precisely controlled liquid dispensers such that the main photoresist coating is not removed.

During the soft-bake step, both solvents and moisture present in the photoresist will evaporate. The water in the photoresist, however, is necessary for the photochemical process that takes place in DNQ/Novolac type photoresists, particularly in thick films. (As known in the art, DNQ indicates diazonaphthoquinone.) Without humidity, the photoresists tend to perform less desirably. A waiting time at room temperature is therefore recommended following the soft bake to allow the photoresist to re-absorb the lost humidity.

Exposure:

The AZ-4000 series photoresists are sensitive to g-, h- and i-line (365 nm, 405 nm, 435 nm respectively) wavelengths. UV lithography is somewhat limited due to a depth of focus and diffraction. And to allow use of UV lithography with thick photoresist layers (e.g., 10 $\mu$m to 200 $\mu$m), special aligners with appropriate diffraction-reducing optics are typically used. For instance, an aligner with Large Exposure Gap Optics (LEGO), such as the SUSS MA150 Mask Aligner, reduces diffraction and increases collimation, achieving a high-resolution printing and steep resist sidewalls in thick films.

The basic parameters of an exposure process are the light intensity and the exposure time, which define the dose in which the photoresist is exposed according to:

$$dose(mJ/cm^2) = intensity(mW/cm^2) \times time(sec)$$

Experimental data shows that, for 5 to 30 $\mu$m thick films of AZ-4620 photoresist, desirable pattern printing and development quality were achieved for a 150–180 second exposure time, defining an advantageous dose of 1800–2160 $mJ/cm^2$ for 25 $\mu$m thick photoresist.

To avoid over-heating the photoresist during relatively long exposures, short (30–60 second) cooling time intervals are useful. For example, a 180 second exposure of 30 $\mu$m thick AZ-4620 film is typically split into two 90 second exposures with a 45 second cooling time between exposures, with wafer/mask contact maintained during the cooling.

Development:

The particular developer used depends on the photoresist material. To make the developing process more efficient for thick photoresist films, agitation is typically used such that the developing solution is constantly being refreshed on the exposed areas. Refreshing of the solution is more difficult for high aspect ratio patterns, because as the photoresist is removed from the exposed areas, the patterns become deeper, and thereby limit the access of a fresh solution. Strong agitation is therefore useful, and because manual control is difficult and provides poor reproducibility, agitation with the help of a stirrer is desirable, e.g., a magnetic stirring bar with a magnetic stirrer plate. The developing time depends on the dilution concentration and the exposure energy dose.

Curing:

To render the photoresist substantially inert to harsh environments like acetone, electroplating baths and metal deposition processes, a curing step is performed. For the AZ-4000 series photoresist, curing is performed, for example, by heating on a hot plate at 220° C. for at least 1 to 2 hours. The cured photoresist provides a strong, chemically inert layer that remains intact during exposure to relatively harsh chemicals. The AZ-4000 series photoresist, as cured, is reported to exhibit a dielectric constant (for curing temperatures in the range 200° C. to 250° C.) of 4.02 to 4.58, with breakdown voltages of 629 to 674 V/$\mu$m.

When a thick resist layer is cured, residual stress in the cured layer is typically unavoidable, and leads in some cases to wafer buckling. The chosen photoresist advantageously has a low residual stress, such that wafer deformation is kept relatively low. However, when consecutive layers of cured photoresist are used, the residual stress effect is more significant than for single layers. For such multiple layer embodiments, stress release channels running from one side of the wafer to another are typically used. The stress is then localized on each device footprint and the wafer buckling is significantly reduced.

In one embodiment, the curing is performed by placing the wafer on a programmable digital hot plate inside a vacuum oven. The temperature of the hot plate is programmed to ramp up, e.g., at a rate of 15° C./hour from room temperature, to the photoresist re-flow temperature, which is approximately 150° C. for the AZ-4000 series photoresists. The wafer stays at the reflow temperature, typically for about 2 hours depending on the thickness of the film, and ramps up to a higher temperature, e.g., 220° C. for the AZ-4000 series, and remains there for about 1 to 2 hours. The wafer is then allowed to slowly cool to room temperature.

The applied vacuum during curing removes air bubbles, which are likely to be created or already trapped on the bottom of the photoresist layer. Keeping the photoresist at its re-flowing temperature under vacuum accelerates the movement of the trapped bubbles towards the surface, where they are released. Failure to remove all bubbles before the curing will tend to result in their rapid expansion at high temperatures. Consequently, it is possible for the photoresist film to be damaged by craters formed during the explosion of bubbles on the surface.

In general, a hot plate is preferred over a conventional baking oven because the bottom-to-top heating of the resist film tends to contribute to more uniform heating of the photoresist body. Specifically, where the resist surface is heated faster than the rest of the resist film, it is possible to encounter crusting that results in a wrinkled surface.

In addition, special attention should be given to wafer cleaning and drying before photoresist spinning, in order to ensure good adhesion of the cured layer and the substrate. Similarly, when multiple cured layers are stacked, the bottom photoresist surface should be thoroughly cleaned, e.g., by an extensive rinse with deionized water.

Iron-Cobalt-Phosphorus Magnetic Alloy

Advantageously, as noted above, micromagnetic devices according to the invention are formed from an amorphous iron-cobalt-phosphorus alloy. The magnetic alloy has a composition of $Co_xP_yFe_z$, where x+y+z=100, x is 5 to 15, y is 13 to 20, and z is the remainder. In one useful embodiment, x is 11 and y is 17. The cobalt and iron provide relatively high saturation magnetization and low coercivity. The phosphorus is present in an amount that provides an amorphous structure, but does not unacceptably lower the saturation magnetization. In particular, the alloy typically exhibits a coercivity of 0.1 to 0.5 Oe, an electrical resistivity of 100 to 150 $\mu\Omega$-cm, and a saturation magnetization of about 16 to about 19 kG. (Permalloy exhibits a coercivity as low as 0.1 Oe depending on the deposition conditions, an electrical resistivity of 20 to 25 $\mu\Omega$-cm, and a saturation magnetization of 9 to 10 kG.) When used in micromagnetics such as discussed above, the magnetic alloy tends to be plated in thicknesses of 5 to 10 $\mu$m. In this thickness range, the devices are able to be used at frequencies of 10 to 30 MHz without significant losses, as shown in the Examples below.

The alloy is generally formed by electroplating, such as in the above process for fabricating an integrated CMOS/micromagnetic component. The integration of micromagnetics with CMOS devices formed on silicon wafers puts some limitations on the processing temperatures available for electroplating, particularly if photoresist is used as insulating material in the integrated component. Thus, while typically it is possible to anneal a magnetic material to define an easy axis of magnetization, such anneals generally must be avoided in such integrated components. One alternative way to define the easy axis is to perform the electroplating in an applied magnetic field. For example, it is possible to use a Helmholtz coil to produce a relatively uniform field over more than half of the coil's inner diameter. With such a coil, it is possible to create a field up to about 75 Gauss with a current of about 15 A, depending on the particular apparatus being used.

A typical bath composition suitable for electroplating the FeCoP alloy is shown in Table 1. Numerous variations in the bath, made in accordance with the guidelines presented herein, are also possible. See also C. Lowrie, "Iron Plating," *Metal Finishing*, '99 Guidebook and Directory Issue, Vol. 97, No. 1 (1999).

TABLE 1

| Material | Formula Weight (g) | Molarity |
| --- | --- | --- |
| Ascorbic Acid | 176.12 | 0.01 |
| $NaH_2PO_2 \cdot H_2O$ | 105.99 | 0.01 |
| $(NH_4)_2SO_4$ | 132.14 | 0.10 |
| $CoSO_4 \cdot 7H_2O$ | 281.1 | 0.01 |
| $FeSO_4 \cdot 7H_2O$ | 278.0 | 1.00 |

The ascorbic acid acts to retard oxidation of $Fe^{+2}$ to $Fe^{+3}$, which will nonetheless occur in solution. To help reduce this oxidation, it is also useful to perform nitrogen sparging during the plating process. Because $H_2$ is evolved at the cathode as an undesired side reaction, the nitrogen bubbles, combined with rapid stirring, help to dislodge the $H_2$ bubbles as they form. This reduces the formation of point defects around the $H_2$ bubbles on the surface of the substrate being plated. (Because of the use of the $N_2$, use of surfactant to remove the oxygen is undesirable, in that the surfactant would cause foaming.) In addition, a soluble iron anode is preferred over an insoluble anode (such as platinized niobium), because $Fe^{+3}$ buildup would otherwise occur, thereby poisoning the cathode and decreasing current efficiency.

Controlling the pH of the plating solution is an important aspect of the process. Specifically, above a certain pH, it is possible for iron hydroxide to form at the electrode surface, causing plating of a brown, hazy deposit. Because the pH will ordinarily rise with time as water is reduced at the cathode to produce $H_2$ and $OH^-$, either a buffer or continuous acid addition should be used to control the pH. For a bath such as shown in Table 1, a pH of about 3 was maintained. (The bath shown in Table 1 was an unbuffered bath requiring addition of acid during plating.) Also, the surface pH will be equal to or greater than the bulk pH, depending on the current density and the rate of agitation in the bath, and this must be considered as well.

The invention will be further clarified by the following examples, which are intended to be exemplary.

EXAMPLES

Experimental Conditions

Silicon wafers were provided with a sputtered seed layer of 12.5 nm Ti and 50 nm Au. Typical sheet resistance of the seed layer was 0.98 ohm-cm. Strips 1.0 cm wide by about 11 cm long were obtained. After electrocleaning, part of each strip was masked with a coating of an acid-resistant polymer resin (3M™ Kel-F 800). A solution of the polymer in amyl acetate was spread on the gold surface and dried in an air oven at 85° C., exposing 4.0 cm at one end for plating and about 2 cm at the other end for electrical connection. In addition, ¾" square samples with approximately 0.16" square holes in the center were prepared, and then the corners were cut off to form hexagonal shapes, for inductance and resistance measurements. The square holes in the center were etched with EDP (ethylene diamine pyrocatechol) after photolithographically defining a pattern on the whole wafer. The wafer was then diced into squares after an identical Ti/Au seed layer was sputtered.

A beaker-like plating vessel was made from 3" diameter glass tubing in which an extremely fine porosity sintered glass frit was sealed 3 mm above the bottom. The space between the bottom of the frit and the bottom of the vessel was made as small as possible so that the maximum amount of coupling between a magnetic stirrer below the vessel and a stirbar above the frit could be achieved. A glass tube was sealed to the vessel to connect to the gap between the frit and the bottom to permit $N_2$ to be bubbled through the solution. The stirbar was 2" long by ⅜" diameter and was spun at 550 RPM.

The anode was made from "Puratronic" grade (99.995%) iron sheet, 50×25×1 mm, and was bolted to a Ti metal strip 4.5"×0.5"×0.02". The Ti exposed to the plating solution was insulated with a commercial lacquer to prevent oxidation of the $Fe^{+2}$. The top of the anode and the Si (Ti/Au) cathode both protruded from and were held in place by a Teflon lid for the plating vessel. The placement of the anode helped to suppress vortex formation from the magnetic stirrer in the central region of the solution while the circumferential flow of the solution was orthogonal to the surface of the cathode to minimize lateral thickness anisotropy. A $Hg/Hg_2SO_4$ reference electrode was connected to the plating solution through a salt bridge containing saturated $K_2SO_4$, with the frit at the end of the bridge positioned just above the top of the area to be plated.

The composition of the plating solution is given in Table 1 above. The purity of the chemicals was Reagent grade except for the $CoSO_4 \cdot 7H_2O$, for which Puratronic grade (99.999%) was selected due to the presence of Cu in the lesser grade. A liter solution was prepared by first deoxygenating 800 ml of 18 MΩ deionized water by bubbling with $N_2$ for 15 minutes, then adding the chemicals in the order shown in Table 1. The final solution was filtered through a 0.2 µm filter, had a pH=3.02, and was a very pale gray in color. The pH was maintained in the range 3.0–3.1 by adding dilute $H_2SO_4$ drop-wise as needed.

Plating experiments were performed using a computer-controlled potentiostat (Radiometer IMT101 Electrochemical Interface and DEA332 Digital Electrochemical Analyzer) to control the voltage and current. A Helmholtz coil was used to apply a vertical field during plating to provide an easy magnetic axis for magnetic measurements. The coils were about 16" outer diameter, 12¾" inner diameter, 1½" thick and were separated by about 7" along their axis. With 15 A current, a field of about 75 Gauss was produced over an area of about 8" diameter in the center of the coils.

After plating on a silicon wafer strip, the polymer coating used to define the electro-active area was removed with amyl acetate and acetone, and the strips were then rinsed in isopropyl alcohol and blow-dried with $N_2$. Samples (3×3 mm) used for either vibrating sample magnetometer (VSM) or elemental analysis were cut from the central part of the strip to reduce thickness variations along the edge of the substrate. Elemental analysis was performed by electron microprobe with a wavelength dispersive X-ray spectrometer. Note that variations inherent in the plating process produced samples of varying thicknesses and compositions, as reflected below.

Example 1

Measurements of coercivity ($H_c$), uniaxial magnetic anisotropy ($H_k$) and saturation magnetization ($B_s$) were made by VSM. A Ni sheet standard was used for calibration of the induction readings. Each sample was measured twice, 90 degrees apart, with the applied field parallel to the easy and hard axes. Coercivity and anistropy characteristics of several alloys are given below. Due to the thickness variations noted above, exact numbers for saturation magnetization are not possible from the test performed, but, based on the VSM data, the $B_s$ values appeared to be from about 16 to about 19 kG.

TABLE 2

| Composition | Thickness (µm) | $H_c$ (Oe) | $H_k$ (Oe) |
| --- | --- | --- | --- |
| $Co_9P_{16}Fe_{75}$ | 1.9 | 1.10 | 13.7 |
| $Co_6P_{13}Fe_{81}$ | 1.7 | 0.33 | 13.9 |
| $Co_{11}P_{13}Fe_{76}$ | 2.2 | 0.48 | 15.1 |
| $Co_9P_{16}Fe_{75}$ | 3.4 | 0.23 | 16.4 |
| $Co_7P_{15}Fe_{78}$ | 6.7 | 0.16 | 23.5 |
| $Co_8P_{13}Fe_{79}$ | 11.3 | 0.11 | 34.5 |

Example 2

The resistivity of several samples was determined with a programmable automatic RCL meter (Philips Model PM6304) by measuring the resistance across a strip of the alloy on the seed layer and the seed layer alone and treating them as parallel resistors. Connection was made using Kapton™ tape and indium solder to define the length of the strip. The average resistivity was about 125 µΩ-cm.

Example 3

Figure 4:
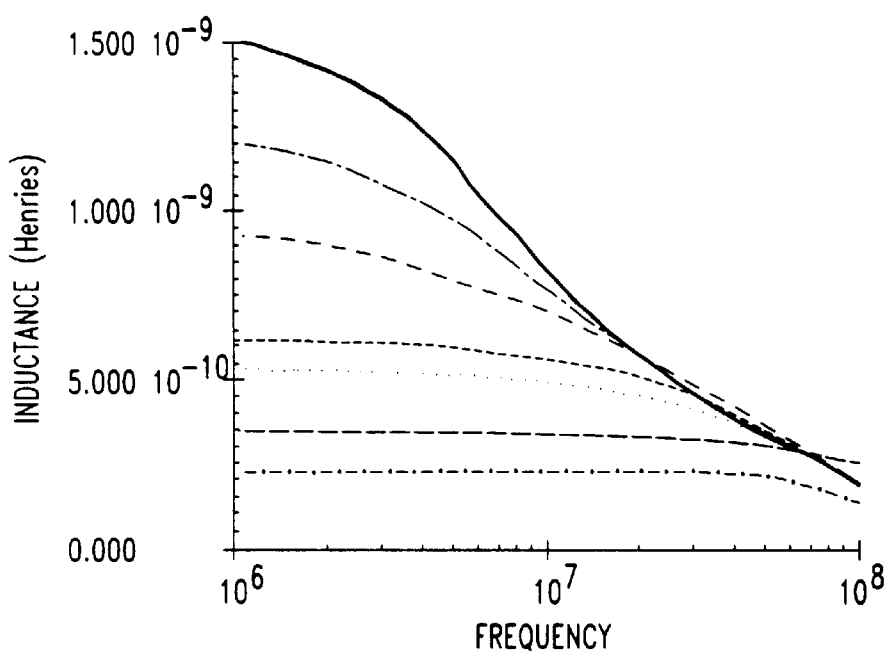
FIG. 4 illustrates inductance vs. frequency for a FeCoP alloy of the invention.
Figure 5:
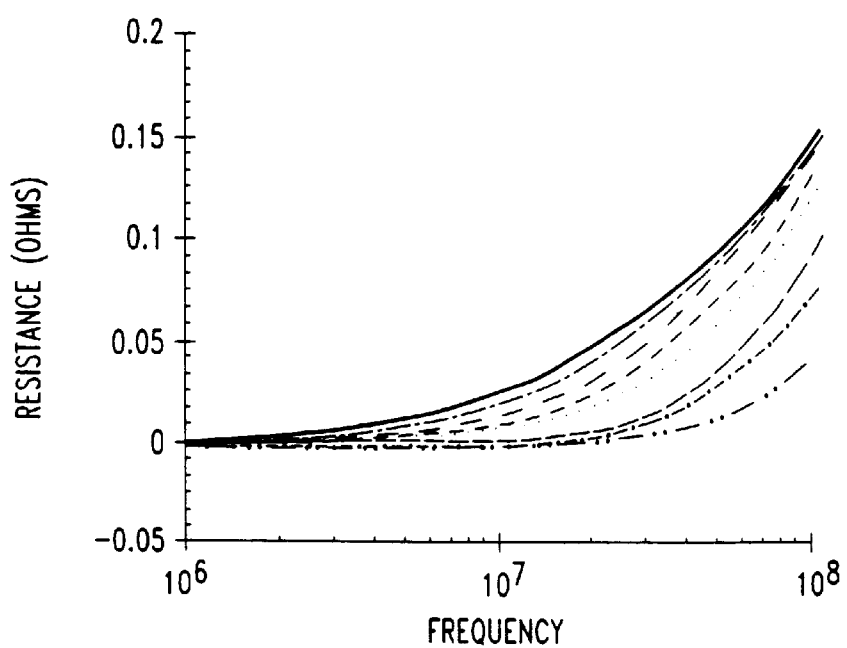
FIG. 5 illustrates resistance vs. frequency for a FeCoP alloy of the invention.

The inductance and AC resistance as a function of frequency were measured for the hexagonal samples described above, using an HP4396 network/impedance analyzer with an HP16454 magnetic material measurement fixture option. The inductance and resistance as a function of frequency are shown in FIGS. 4 and 5, for a variety of film thicknesses. Specifically, in both Figures, the plots, from top to bottom, are for thicknesses of 20.2 µm, 15.6 µm, 9.89 µm, 8.13 µm, 5.96 µm, 3.96 µm, 3.93 µm, and 1.77 µm.

Other embodiments of the invention will be apparent to those skilled in the art from consideration of the specification and practice of the invention disclosed herein.

What is claimed is:

1. An integrated circuit device, comprising:

a wafer containing an integrated circuit; and a magnetic component located over the integrated circuit, the magnetic component comprising an alloy of the composition $Co_xP_yFe_z$, where $x+y+z=100$, x is 5 to 15, y is 13 to 20, and z is the remainder.

2. The integrated circuit device of claim 1, wherein the alloy exhibits a coercivity of 0.1 to 0.5 Oe, an electrical resistivity of 100 to 150 $\mu\Omega$-cm, and a saturation magnetization of about 16 to about 19 kG.

3. The integrated circuit device of claim 1 wherein x is 11 and y is 17.

4. The integrated circuit device of claim 1 wherein the alloy is an amorphous alloy.

5. The integrated circuit device of claim 1 wherein the magnetic component includes a magnetic core and an electrically conductive winding adjacent the magnetic core, wherein the magnetic core comprises the alloy.

6. The integrated circuit device of claim 1 wherein the magnetic component includes:

a first patterned photoresist layer located over the wafer;

a magnetic material layer or an electrically conductive material layer located in the pattern defined by the first patterned photoresist layer;

an insulating and planarizing photoresist layer located over the magnetic material layer or the electrically conductive material layer;

a second patterned photoresist layer located over the insulating and planarizing photoresist layer; and a magnetic material layer or an electrically conductive material layer located over the insulating and planarizing photoresist layer and in the pattern defined by the second patterned photoresist layer, wherein at least one of the magnetic or electrically conductive material layers located in the patterns defined by the first and second patterned photoresist layers is magnetic.

7. The integrated circuit device of claim 6 wherein the magnetic material layer is a magnetic core and the electrically conductive material layer is a winding.

8. The integrated circuit device of claim 6 wherein the magnetic component further includes:

a second insulating and planarizing photoresist layer located over the magnetic material layer or the electrically conductive material layer located in the pattern defined by the second patterned photoresist layer;

a third patterned photoresist layer located over the second insulating and planarizing photoresist layer; and a magnetic material layer or an electrically conductive material layer located in the pattern defined by the third patterned photoresist layer.

9. The integrated circuit device of claim 6 wherein the electrically conductive material layer has a thickness of at least 5 $\mu$m and the magnetic material layer has a thickness of at least 2 $\mu$m.

10. The integrated circuit device of claim 6 wherein the electrically conductive material layer has a thickness of at least 30 $\mu$m and the magnetic material layer has a thickness of at least 5 $\mu$m.

11. The integrated circuit device of claim 6 further comprising:

a first electroplating seed layer on which is formed the magnetic material layer or the electrically conductive material layer located in the pattern defined by the first patterned photoresist layer; and a second electroplating seed layer on which is formed the magnetic material layer or the electrically conductive material layer located in the pattern defined by the second patterned photoresist layer.

12. The integrated circuit device of claim 11 wherein one of the first and second electroplating seed layers comprises gold and the electrically conductive material layer located on the one comprises copper.

13. A method of forming an integrated circuit device, comprising:

forming an integrated circuit in a wafer; and forming a magnetic component over the integrated circuit, the magnetic component comprising an alloy of the composition $Co_xP_yFe_z$, where $x+y+z=100$, x is 5 to 15, y is 13 to 20, and z is the remainder.

14. The method of claim 13 wherein the alloy exhibits a coercivity of 0.1 to 0.5 Oe, an electrical resistivity of 100 to 150 $\mu\Omega$-cm, and a saturation magnetization of about 16 to about 19 kG.

15. The method of claim 13 wherein x is 11 and y is 17.

16. The method of claim 13 wherein the alloy is an amorphous alloy.

17. The method of claim 13 wherein forming the magnetic component includes electroplating the alloy.

18. The method of claim 13 wherein forming the magnetic component includes electroplating the alloy in a magnetic field.

19. The method of claim 13 wherein forming the magnetic component includes electroplating the alloy in a bath comprising:

ascorbic acid;

$NaH_2PO_2.H_2O$;

$(NH_4)_2SO_4$;

$CoSO_4.7H_2O$; and $FeSO_4.7H_2O$.

20. The method of claim 19 wherein forming the magnetic component in the bath includes maintaining a pH of the bath at about 3.

* * * * *